United States Patent
Asaba

(10) Patent No.: US 7,679,112 B2
(45) Date of Patent: Mar. 16, 2010

(54) COLOR IMAGE SENSORS HAVING PIXELS WITH CYAN-TYPE AND YELLOW-TYPE COLOR CHARACTERISTICS THEREIN

(75) Inventor: Tetsuo Asaba, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 30 days.

(21) Appl. No.: 11/932,268

(22) Filed: Oct. 31, 2007

(65) Prior Publication Data

US 2008/0179641 A1 Jul. 31, 2008

(30) Foreign Application Priority Data

Jan. 30, 2007 (KR) .................... 10-2007-0009202

(51) Int. Cl.
*H01L 31/113* (2006.01)

(52) U.S. Cl. .................. 257/291; 257/292; 257/293; 257/440; 257/458; 257/463

(58) Field of Classification Search ............... 257/291, 257/292, 293, 440, 458, 463
See application file for complete search history.

(56) References Cited

U.S. PATENT DOCUMENTS

| | | | |
|---|---|---|---|
| 3,971,065 A | 7/1976 | Bayer | |
| 5,965,875 A * | 10/1999 | Merrill | ............ 250/226 |
| 6,157,017 A | 12/2000 | Kim | |
| 6,392,216 B1 | 5/2002 | Peng-Tan | |
| 6,548,833 B1 | 4/2003 | Lin et al. | |
| 6,930,336 B1 * | 8/2005 | Merrill | ............ 257/292 |
| 6,933,976 B1 | 8/2005 | Suzuki | |
| 6,964,916 B2 | 11/2005 | Kuo et al. | |
| 6,965,691 B2 | 11/2005 | Walmsley et al. | |
| 7,034,873 B2 | 4/2006 | Mendis et al. | |
| 7,142,239 B2 | 11/2006 | Cho | |
| 7,166,880 B2 * | 1/2007 | Merrill | ............ 257/294 |
| 7,181,092 B2 | 2/2007 | Tsukioka | |
| 7,236,190 B2 | 6/2007 | Yanof et al. | |
| 7,358,563 B2 * | 4/2008 | Lee | ............ 257/327 |
| 7,419,844 B2 * | 9/2008 | Lee et al. | ............ 438/48 |
| 7,453,110 B2 * | 11/2008 | Hwang | ............ 257/291 |
| 7,479,997 B2 * | 1/2009 | Hayakawa | ............ 348/272 |
| 7,528,870 B2 * | 5/2009 | Hayakawa | ............ 348/272 |
| 2003/0124753 A1 | 7/2003 | Wang et al. | |
| 2005/0280730 A1 | 12/2005 | Lim et al. | |

(Continued)

FOREIGN PATENT DOCUMENTS

KR 1020020027016 A 4/2002

OTHER PUBLICATIONS

"RGB 'Bayer' Color and Microlenses", downloaded Aug. 20, 2007 from http://www.siliconimaging.com/RGB%20Bayer.htm, 7 pp.

*Primary Examiner*—Long Pham
(74) *Attorney, Agent, or Firm*—Myers Bigel Sibley & Sajovec

(57) ABSTRACT

Color image sensors include pixels having varying color characteristics. One of the pixels is a cyan-type pixel, which includes primary and secondary photodetectors therein. The primary photodetector extends adjacent a portion of a surface of a semiconductor substrate that is configured to receive visible light incident thereon. The secondary photodetector is buried in the semiconductor substrate. The secondary photodetector is configured to receive visible light that has passed through the primary photodetector.

7 Claims, 10 Drawing Sheets

U.S. PATENT DOCUMENTS

| | | |
|---|---|---|
| 2006/0138488 A1 | 6/2006 | Kim |
| 2006/0138531 A1* | 6/2006 | Lee .......................... 257/327 |
| 2006/0208289 A1* | 9/2006 | Ohkawa et al. ............. 257/291 |
| 2006/0244087 A1 | 11/2006 | You et al. |
| 2006/0284274 A1 | 12/2006 | Lee et al. |
| 2007/0012966 A1 | 1/2007 | Park |
| 2007/0034965 A1 | 2/2007 | Jung et al. |
| 2007/0057338 A1 | 3/2007 | Lee et al. |
| 2007/0063299 A1 | 3/2007 | Hwang |
| 2007/0218613 A1* | 9/2007 | Lee et al. .................... 438/197 |
| 2008/0157249 A1* | 7/2008 | Hwang ....................... 257/432 |

* cited by examiner

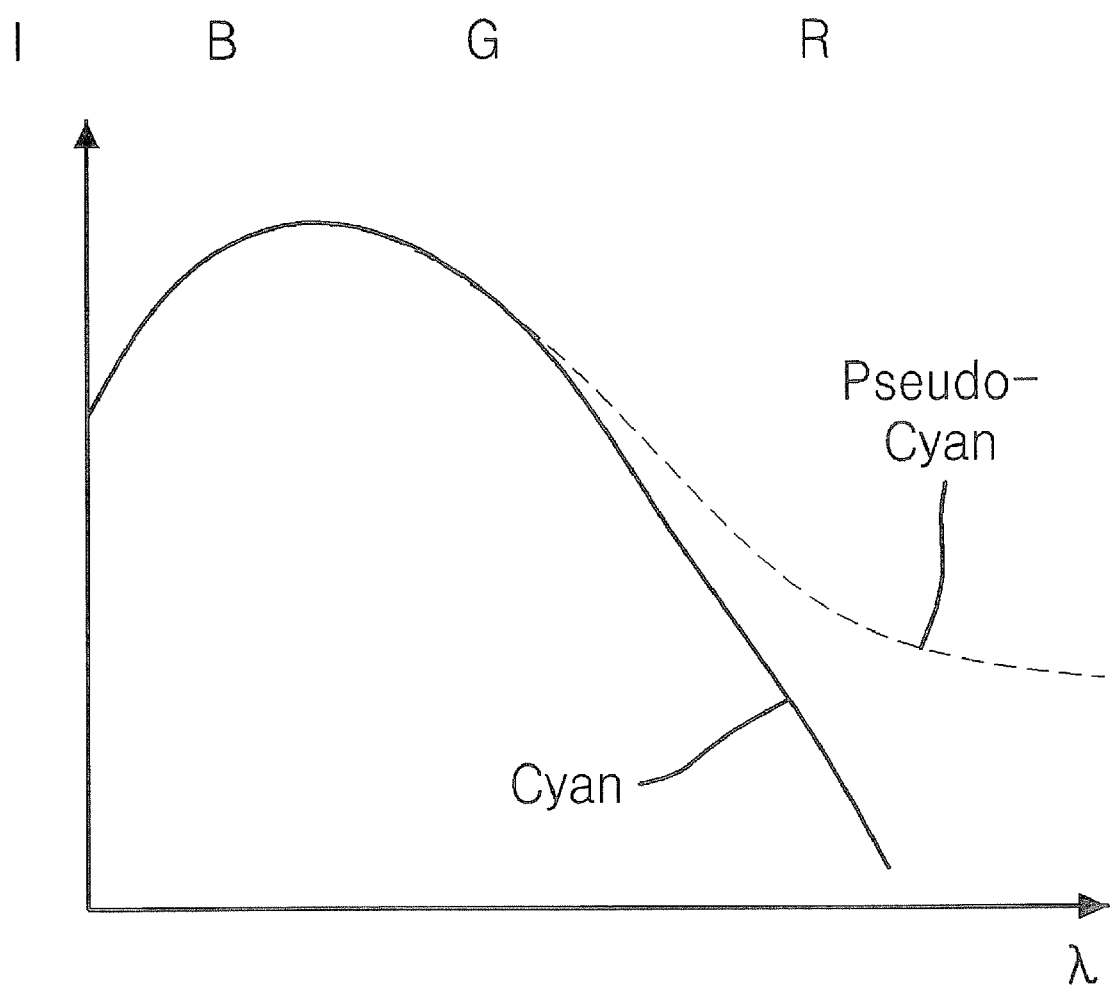

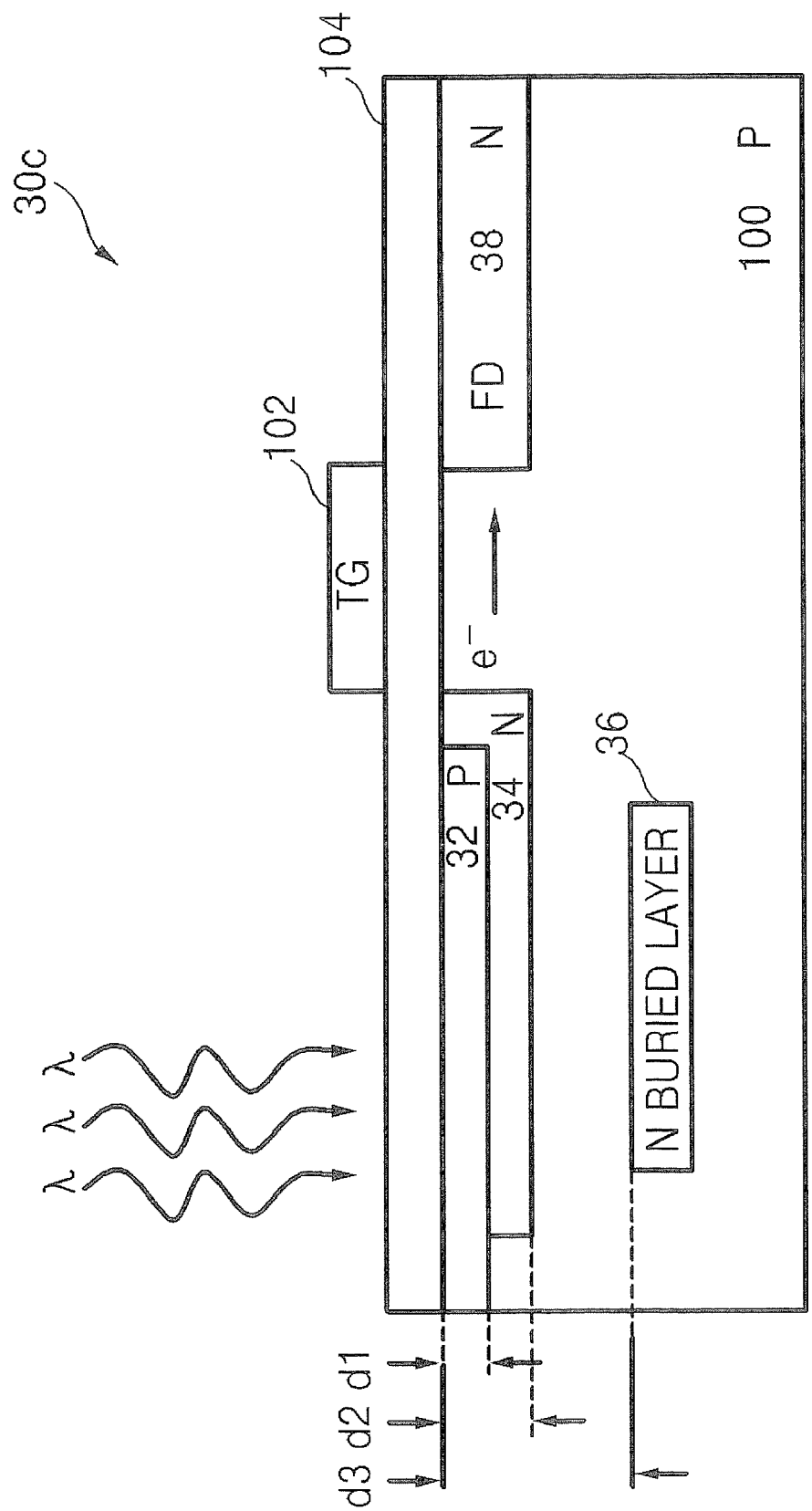

COLOR IMAGE SENSORS HAVING PIXELS WITH CYAN-TYPE AND YELLOW-TYPE COLOR CHARACTERISTICS THEREIN

REFERENCE TO PRIORITY APPLICATION

This application claims priority under 35 USC §119 to Korean Application Serial No. 10-2007-0009202, filed Jan. 30, 2007, the disclosure of which is hereby incorporated herein by reference.

FIELD OF THE INVENTION

The present invention relates to integrated circuit devices and, more particularly, to integrated circuit image sensing devices.

BACKGROUND OF THE INVENTION

CMOS image sensors typically include a two-dimensional array of image sensor cells formed within an integrated circuit substrate. To achieve color expression within the sensor, an organic color filter array may be formed on the two-dimensional array of image sensor cells and a micro-lens array may be formed on the color filter array. The color filter array may include a mosaic pattern of red (R), green (G) and blue (B) color filters disposed opposite corresponding image sensor cells (i.e., pixels) within the two-dimensional array. An exemplary CMOS image sensor having a micro-lens array and color filter array therein is disclosed in U.S. Pat. No. 6,517,017 to Kim entitled "Solid-State Imaging Devices Having Combined Microlens and Light Dispersion Layers for Improved Light Gathering Capability and Methods of Forming Same." A typical color filter array may include a repeating 4-pixel mosaic pattern of red-green-green-blue (RGGB) color filters. Alternative color filter arrays may include a repeating yellow-magenta-cyan (YMC) pattern, a repeating yellow-cyan-white (YCW) pattern or repeating cyan-yellow-green-magenta (CYGM) pattern.

As illustrated by FIG. 1, a conventional four transistor (4T) CMOS image sensor cell 10 includes a buried photodiode (BPD), an image transfer transistor T1 responsive to a transfer signal TX, a reset transistor T2 responsive to a reset signal RX, a drive transistor T3 responsive to a drive signal DX and a select transistor T4 responsive to a select signal SX. The select transistor T4 drives an output node OUT of the sensor cell 10, which is electrically connected to a load transistor T5 responsive to a bias signal Vb. The gate terminal of the drive transistor T3 is connected to a floating diffusion (FD) region, which is electrically connected to a drain of the transfer transistor T1 and a source of the reset transistor T2. This floating diffusion region is schematically illustrated as a capacitor (Cfd). The floating diffusion region receives charge carriers from the buried photodiode upon enablement of the image transfer transistor T1. These charge carriers are generated when photon radiation is received by the photodiode and electron-hole pairs are generated therein. The charge carriers transferred to the floating diffusion region operate to bias the gate terminal of the drive transistor T3. In addition, enablement of the reset transistor T2 operates to reset the floating diffusion region by electrically coupling this region to a positive power supply voltage VDD.

Additional CMOS image sensors may utilize photodiodes of varying dimensions to capture different colored light. One such image sensor is disclosed in U.S. Patent Publication No. 2007/0063299 to Hwang entitled "CMOS Image Sensor and Method of Manufacturing the Same." Still further image sensors are disclosed in U.S. Pat. Nos. 6,548,833, 5,965,875 and 6,964,916 and U.S. Patent Publication Nos. 2003/0124753 and 2007/0057338.

SUMMARY OF THE INVENTION

Embodiments of the present invention include color image sensors having pixels with varying color characteristics. According to some of these embodiments, an image sensor is provided with a pixel (i.e., image sensor cell) having cyan-type color characteristics. This pixel having cyan-type color characteristics may include primary and secondary photodetectors. The primary photodetector extends adjacent a portion of a surface of a semiconductor substrate that is configured to receive visible light incident thereon. The secondary photodetector is buried in the semiconductor substrate. The secondary photodetector has a first charge carrying terminal electrically coupled to a node of the image sensor, which is biased at a first voltage. In some cases, this first voltage may be a positive voltage, such as a power supply voltage (e.g., Vdd).

According to additional aspects of these embodiments, the secondary photodetector is configured to receive visible light that has passed through the primary photodetector. Moreover, the primary photodetector may include a first photodiode, which has a cathode electrically connected to a first source/drain region of a transfer transistor, and the secondary photodetector may include a second photodiode having a cathode electrically connected to the node and an anode that forms a P-N rectifying junction with the cathode of the first photodiode. The electrical connection between the cathode of the second photodiode and the node may be provided by an N-type semiconductor region within the semiconductor substrate. A second source/drain region of the transfer transistor may operate as a floating diffusion region within the image sensor.

According to still further embodiments of the present invention, an image sensor that is free of organic filters includes a semiconductor substrate and a 2×2 array of pixels in the semiconductor substrate. The 2×2 array of pixels includes at least first and second pixels having different light gathering characteristics. The first pixel includes a primary photodetector, which extends adjacent a first portion of a surface of a semiconductor substrate, and a secondary photodetector, which is buried underneath the primary photodetector in the semiconductor substrate. The secondary photodetector has a first charge carrying terminal electrically coupled to a node of the first pixel, which is biased at a first voltage (e.g., Vdd). The second pixel may include a photodetector extending adjacent a second portion of a surface of a semiconductor substrate and a visible light absorption layer (e.g., polysilicon layer) on the second portion of the surface. The image sensor may also include third and fourth pixels, which have equivalent light gathering characteristics. The light gathering characteristics of the third and fourth pixels may be different from the light gathering characteristics of the first and second pixels.

According to additional embodiments of the present invention, an image sensor includes a mosaic pattern of pixels having an equivalent number of cyan-type and yellow-type pixels interspersed among pixels having white color characteristics. The mosaic pattern of pixels includes N cyan-type pixels interspersed among N yellow-type pixels and 2N pixels having white color characteristics, where N is a positive integer. In particular, the mosaic pattern of pixels may include a plurality of 2×2 arrays of pixels, with each of the plurality of the 2×2 arrays of pixels including a cyan-type pixel diagonally opposite a yellow-type pixel and a white-type pixel diagonally opposite another white-type pixel.

Still further embodiments of the present invention include a color interpolation method for a image sensor having a 2×2 array of pixels including first and second white-type pixels, a third yellow-type pixel and a fourth cyan-type pixel. These methods include interpolating third and fourth white color values for the third and fourth pixels, respectively, from first and second white color values generated by the first and second pixels. These methods also include determining a fourth red color value for the fourth pixel from the fourth white color value and a cyan color value generated by the fourth pixel and then interpolating first, second and third red color values for the first, second and third pixels, respectively, from the fourth red color value.

The methods may also include determining a third blue color value for the third pixel from the third white color value and a yellow color value generated by the third pixel and then interpolating first, second and fourth blue color values for the first, second and fourth pixels, respectively, from the third blue color value. First, second, third and fourth green color values are also determined for the first, second, third and fourth pixels, respectively. These green color values are determined from the first through fourth white color values, the first through fourth red color values and the first through fourth blue color values.

BRIEF DESCRIPTION OF THE DRAWINGS

FIG. 2B is a graph illustrating color characteristics of a cyan-type pixel according to embodiments of the present invention.

FIG. 3A is a cross-sectional view of a portion of a cyan-type pixel according to embodiments of the present invention.

DESCRIPTION OF PREFERRED EMBODIMENTS

Figure 1:
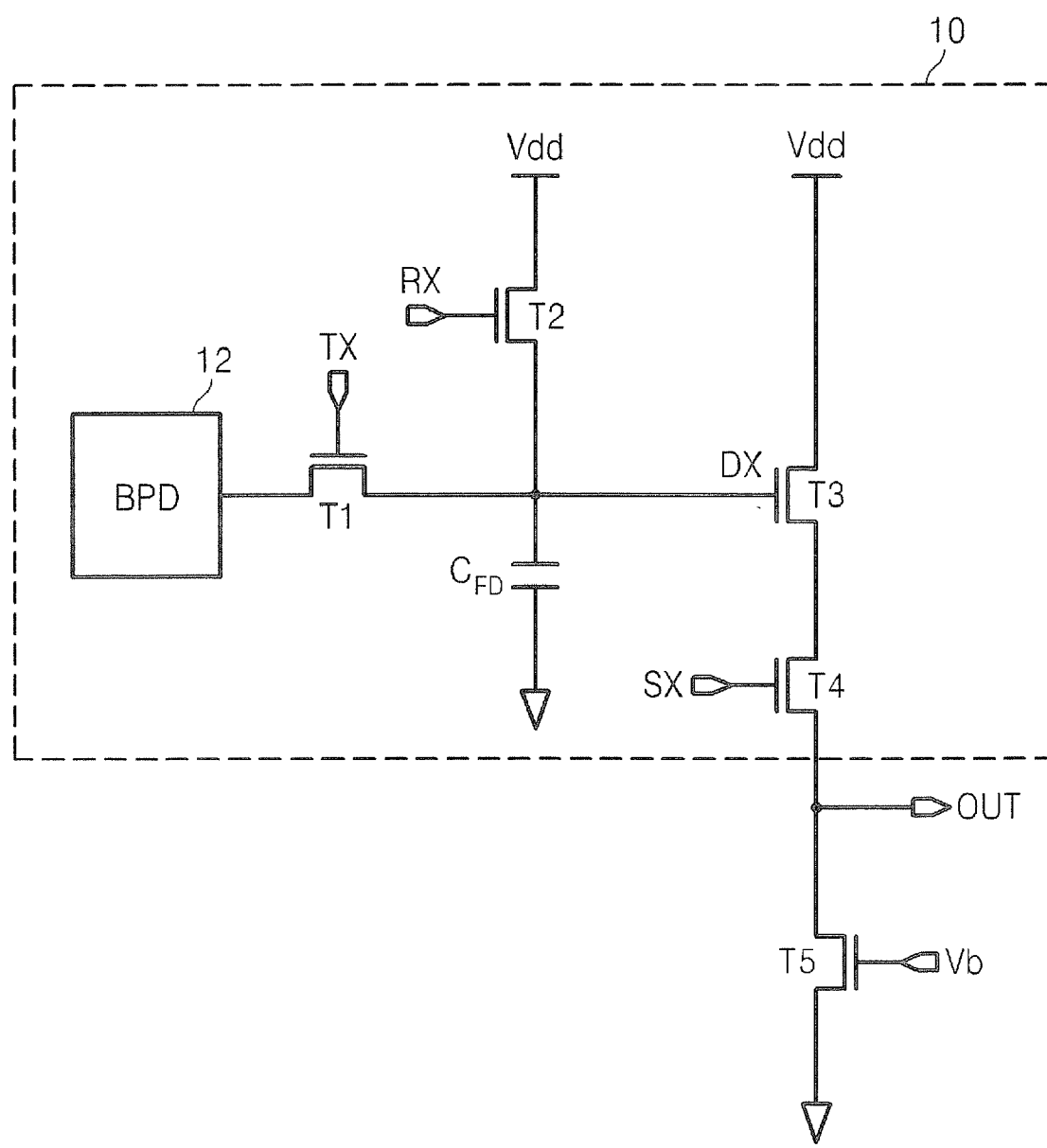
FIG. 1 is an electrical schematic of a four transistor (4T) CMOS image sensor cell, according to the prior art.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout.

Figure 2A:
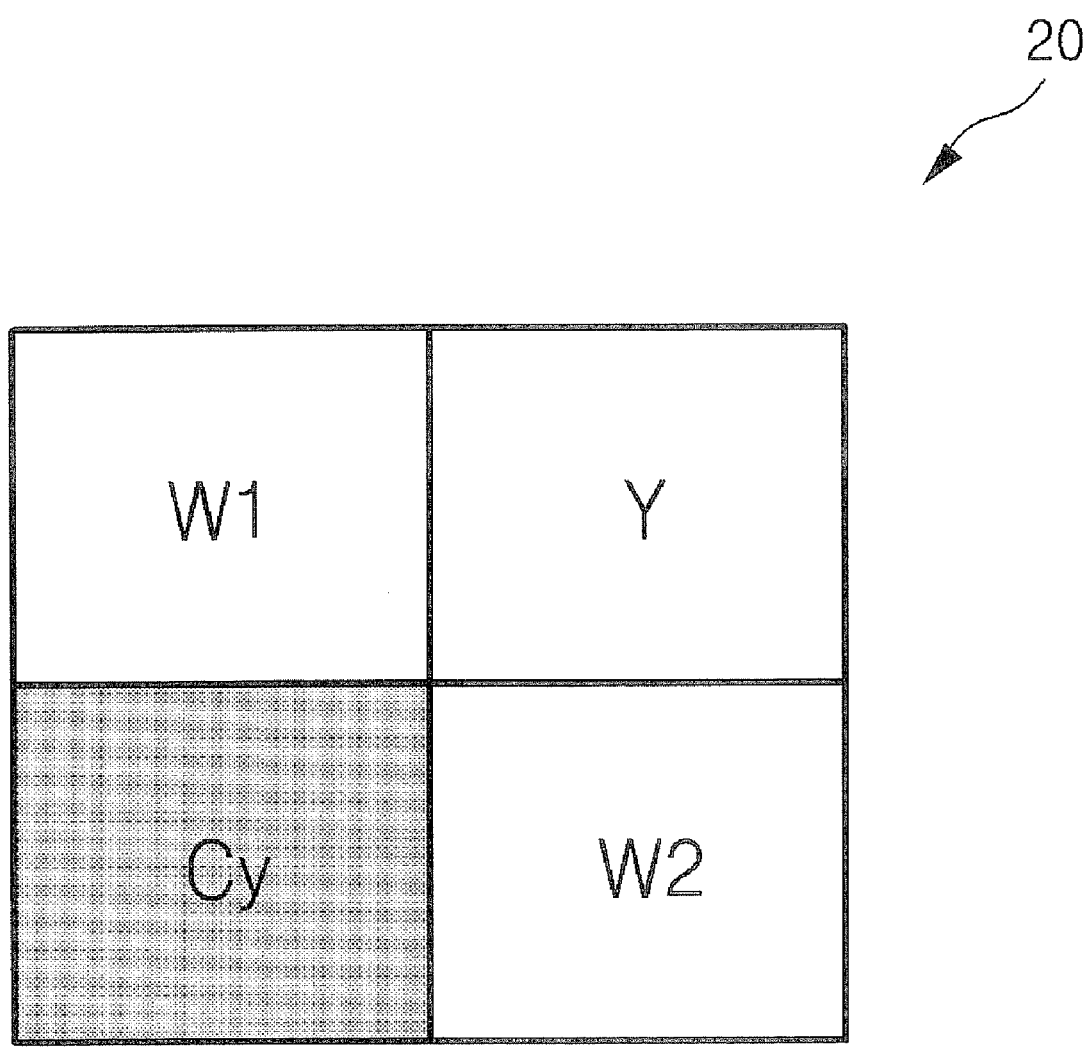
FIG. 2A is a diagram that illustrates a 2×2 array of CMOS image sensor cells (i.e., pixels) having white (W1, W2), cyan-type (Cy) and yellow-type (Y) color characteristics, according to embodiments of the present invention.
Figure 2C:
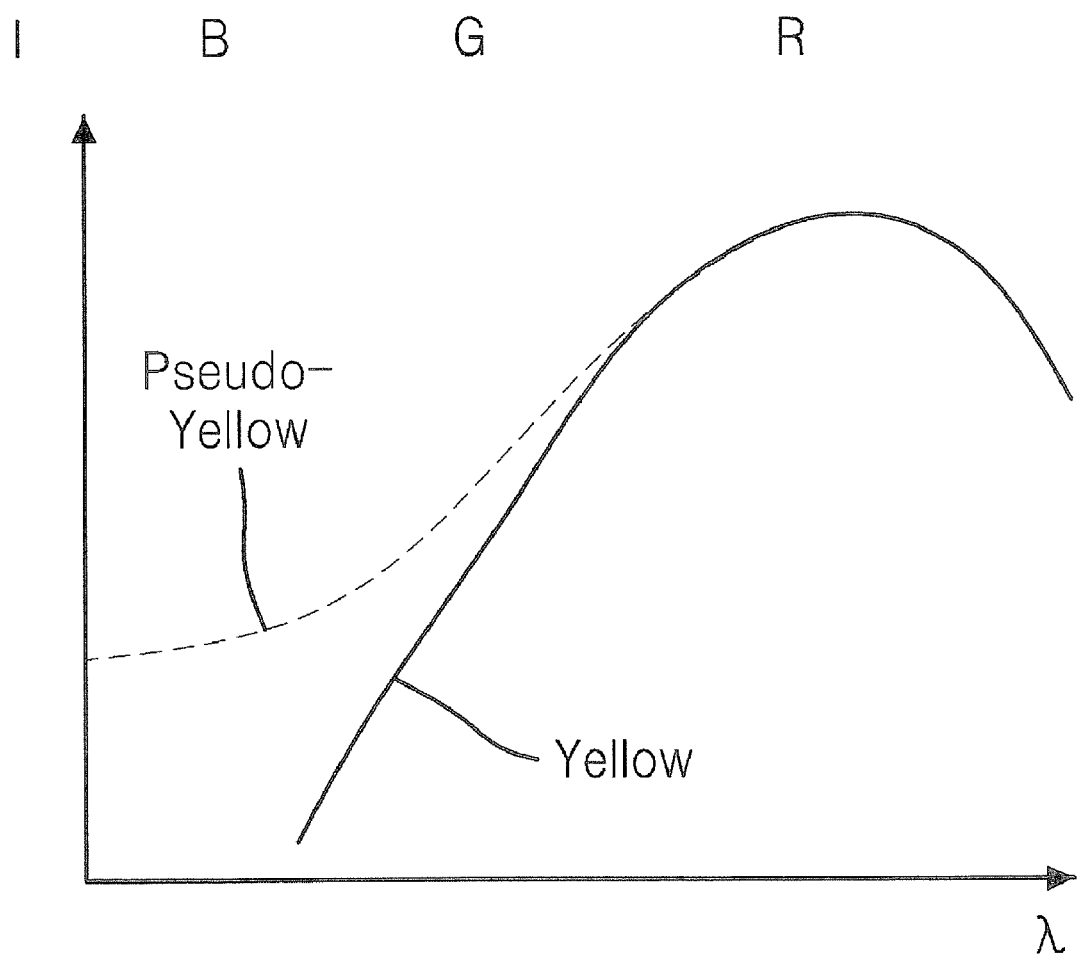
FIG. 2C is a graph illustrating color characteristics of a yellow-type pixel according to embodiments of the present invention.

Referring now to FIG. 2A, a 2×2 array 20 of CMOS image sensor cells (i.e., pixels) according to embodiments of the present invention includes white (W1, W2), cyan-type (Cy) and yellow-type (Y) color pixels arranged as illustrated. As described more fully hereinbelow with respect to FIGS. 3A-3D, these sensor cells are formed within a substrate having a semiconductor region 100 therein. This semiconductor region 100 extends adjacent a surface of the substrate, which is configured to receive visible light (e.g., an image to be captured) thereon. As illustrated by FIG. 2B, the color characteristics of the cyan-type (Cy) pixel, which are reflected by the curve labeled "pseudo-cyan", approximate the color characteristics of a conventional pixel with a cyan filter (not shown) having dominant blue (B) and green (G) color intensities (I) associated with shorter wavelength visible light. The color characteristics of the conventional pixel with a cyan filter are reflected by the curve labeled "cyan" in FIG. 2B. In contrast, as illustrated by FIG. 2C, the color characteristics of the yellow-type (Y) pixel, which are reflected by the curve labeled "pseudo-yellow", approximate the color characteristics of a conventional pixel with a yellow filter (not shown) having dominant green (G) and red (R) color intensities (I) associated with longer wavelength visible light. The color characteristics of the conventional pixel with a yellow filter are reflected by the curve labeled "yellow" in FIG. 2C. The color characteristics of the white-type pixels (W1 and W2) may be represented by an intensity curve (not shown) having relatively uniform blue, green and red light capture characteristics. These color characteristics of the white-type pixels may be similar to those of a conventional pixel in the absence of a color filter.

Figure 3B:
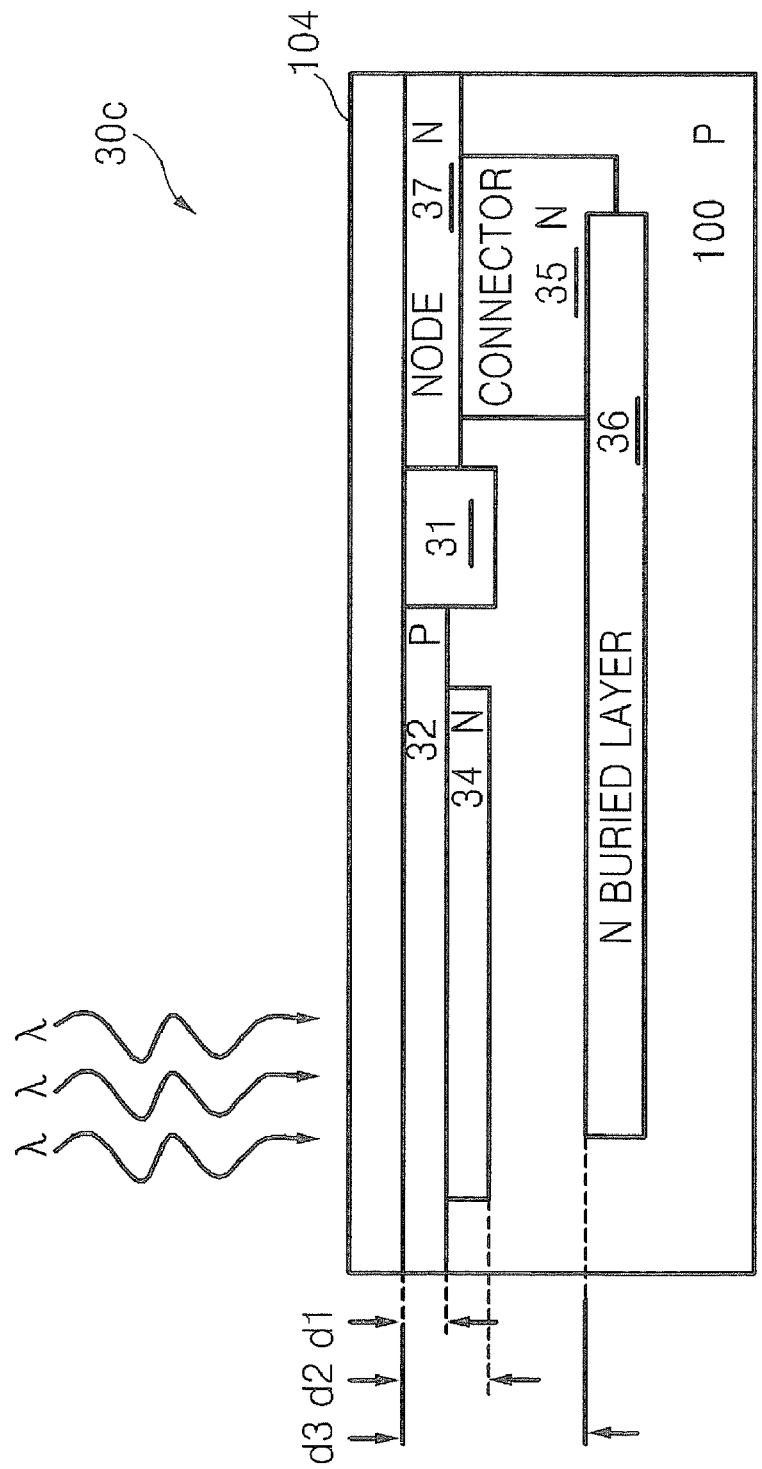
FIG. 3B is another cross-sectional view of the cyan-type pixel of FIG. 3A, taken in a direction orthogonal to the direction of the view illustrated by FIG. 3A.

FIGS. 3A-3B illustrate a light receiving portion of a cyan-type pixel 30c according to an embodiment of the present invention. In particular, FIG. 3A is a cross-sectional view of a portion of a cyan-type pixel 30c and FIG. 3B is another cross-sectional view of the cyan-type pixel 30c of FIG. 3A, taken in a direction orthogonal to the direction of the view illustrated by FIG. 3A. As illustrated, the cyan-type pixel 30c includes a semiconductor region 100 (e.g., semiconductor substrate) of first conductivity type (e.g., P-type) having a primary surface that is configured to receive visible light (λ) thereon. An electrically insulating layer 104, which is provided on the primary surface, may be utilized as a gate insulating layer for a gate electrode 102 of a transfer transistor within an image sensor cell (e.g., 4T cell). The illustrated portion of the cyan-type pixel 30c includes a primary photodetector extending immediately adjacent a portion of the primary surface and a secondary photodetector buried in the P-type semiconductor region 100. As illustrated, the secondary photodetector is positioned to receive visible light that has passed through the primary photodetector.

According to the illustrated embodiment of FIGS. 3A-3B, the primary photodetector may be a first P-N junction photodiode having a P-type region 32 disposed at least partially within an underlying N-type region 34. The depth ($d_1$) of the P-type region 32 may be in a range from about 0.05 um to about 0.3 um and the depth ($d_2$) of the N-type region 34 may be in a range from about 0.3 um to about 1.0 um. This P-type region 32 operates as an anode of the first P-N junction photodiode and the N-type region 34 operates as a cathode of the first P-N junction photodiode. The secondary photodetector may include a second P-N junction photodiode having an N-type region, which may be formed as a buried N-type layer 36 within a surrounding P-type semiconductor region 100. The N-type buried layer 36 operates as a cathode of the second P-N junction photodiode and the closely surrounding P-type semiconductor region 100 operates as an anode of the second P-N junction photodiode. As illustrated by FIG. 3B, the cathode of the second P-N junction photodiode, which represents a charge carrying terminal of the secondary photodetector, is electrically coupled to a node of the cyan-type pixel 30c. In some embodiments of the cyan-type pixel 30c, the node may be an N-type region 37 within the semiconductor region 100, which is biased at a first voltage. This first voltage may be a positive voltage, such as a positive power supply voltage (e.g., Vdd). An N-type connector region 35 may be provided within the substrate, as illustrated, in order to electrically connect the N-type buried layer 36 to the N-type node region 37.

Referring again to FIG. 3A, the first P-N junction photodiode is configured to be relatively shallow to thereby selectively detect primarily blue and green wavelength light and to pass primarily red wavelength light, as illustrated by FIG. 2B. In contrast, the second P-N junction photodiode, which is buried beneath the first P-N junction photodiode with the semiconductor region 100, is configured to selectively detect primarily red wavelength light by virtue of its distance ($d_3$) from the primary surface. This distance $d_3$ may be in a range from about 0.5 um to about 3.0 um.

The detection of primarily blue and green light by the first P-N junction photodiode results in the generation of electron-hole pairs within a depletion region of the first P-N junction photodiode. As will be understood by those skilled in the art, electrons (e⁻) collected by the N-type region 34 may be transferred to an N-type floating diffusion (FD) region 38 by operation of the transfer gate electrode 102. This transfer is provided by an N-type inversion layer channel (not shown) that may be established in the P-type region 100 in response to application of a sufficiently positive bias to the transfer gate electrode 102. In contrast, the detection of primarily red light by the second P-N junction photodiode results in the generation of electrons within the N-type buried layer 36, which are collected by the positively biased node region 37. In this manner, the light receiving portion of a cyan-type pixel 30c illustrated by FIGS. 3A-3B replaces the conventional buried photo diode 12 within an image sensor cell (e.g., 4T cell). However, according to alternative embodiments of the present invention, the electrons collected by the N-type buried layer 36 may be passed to circuitry (not shown) within the pixel and separately processed to facilitate calculation of red light color values associated with the visible light incident on the primary surface.

Figure 3C:
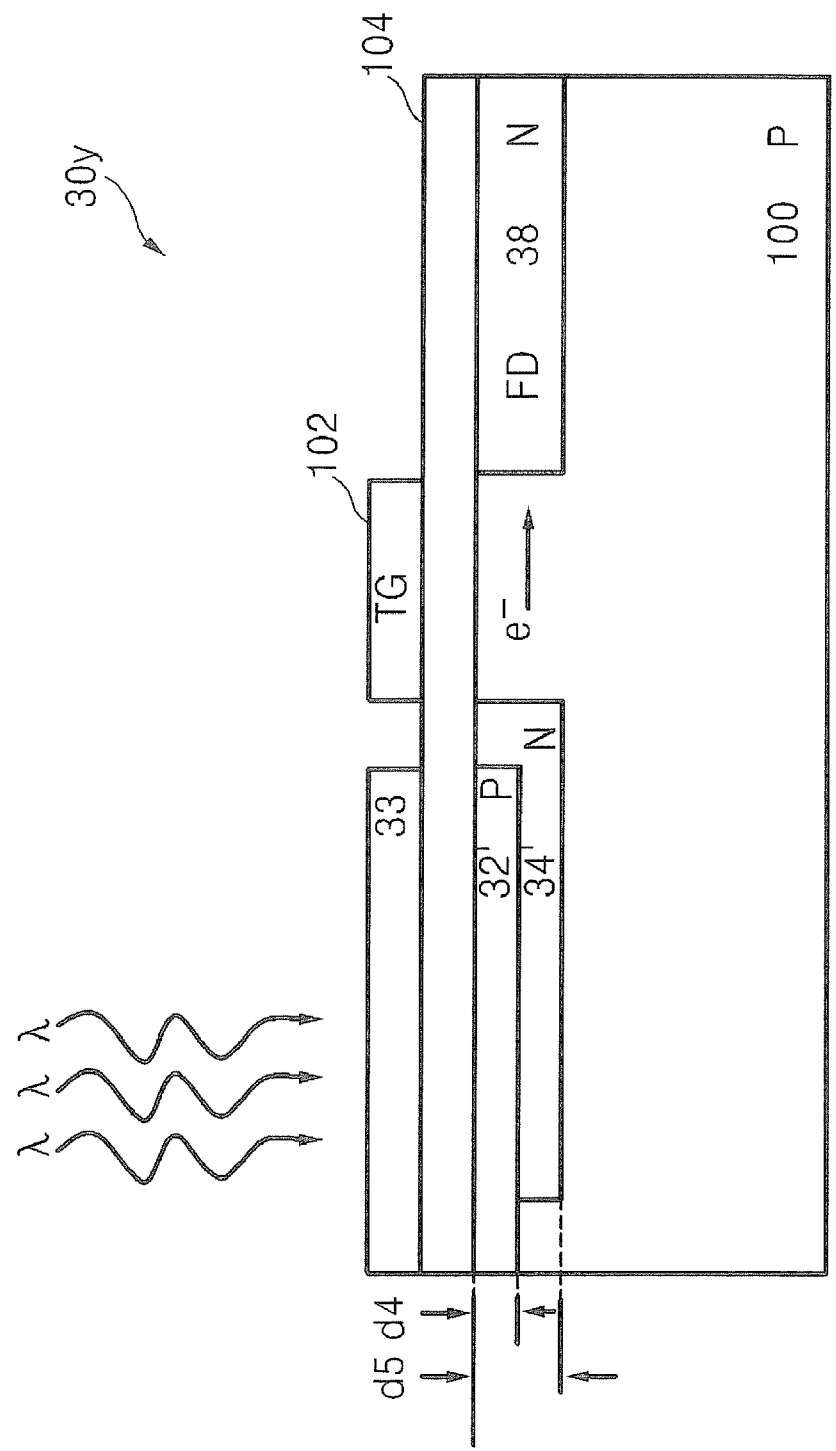
FIG. 3C is a cross-sectional view of a portion of a yellow-type pixel according to embodiments of the present invention.

Referring now to FIG. 3C, a light receiving portion of a yellow-type pixel 30y according to an embodiment of the present invention includes a semiconductor region 100 (e.g., semiconductor substrate) of first conductivity type (e.g., P-type) having a primary surface that is configured to receive visible light (λ) thereon. An electrically insulating layer 104, which is provided on the primary surface, may be utilized as a gate insulating layer for a gate electrode 102 of a transfer transistor within an image sensor cell (e.g., 4T cell). The illustrated portion of the yellow-type pixel 30y includes a photodetector extending immediately adjacent a corresponding portion of the primary surface. The photodetector may be a P-N junction photodiode having a P-type region 32' disposed at least partially within an underlying N-type region 34'. The depth $d_4$ of the P-type region 32' may be in a range from about 0.05 um to about 0.3 um and the depth $d_5$ of the N-type region 34' may be in a range from about 0.3 um to about 1.0 um. This P-type region 32' operates as an anode of the P-N junction photodiode and the N-type region 34' operates as a cathode of the P-N junction photodiode.

A visible light absorption layer 33 is provided on the primary surface, as illustrated. According to some embodiments of the present invention, this visible light absorption layer 33 may be a polysilicon layer having a thickness in a range from about 1000 Å to about 4000 Å. This light absorption layer 33 is of sufficient thickness to absorb primarily blue and green wavelength light. Accordingly, the underlying P-N junction photodiode defined by P-type region 32' and N-type region 34' operates to receive primarily red wavelength light.

The detection of primarily red and green light by the P-N junction photodiode of FIG. 3C results in the generation of electron-hole pairs within the N-type region 34'. The electrons (e⁻) collected by the N-type region 34' may be transferred to an N-type floating diffusion (FD) region 38 by operation of the transfer gate electrode 102. This transfer is provided by an N-type inversion layer channel (not shown) that is established in the P-type region 100 in response to application of a sufficiently positive bias to the transfer gate electrode 102. In this manner, the light receiving portion of the yellow-type pixel 30y illustrated by FIG. 3C replaces the conventional buried photo diode 12 within an image sensor cell (e.g., 4T cell).

Figure 3D:
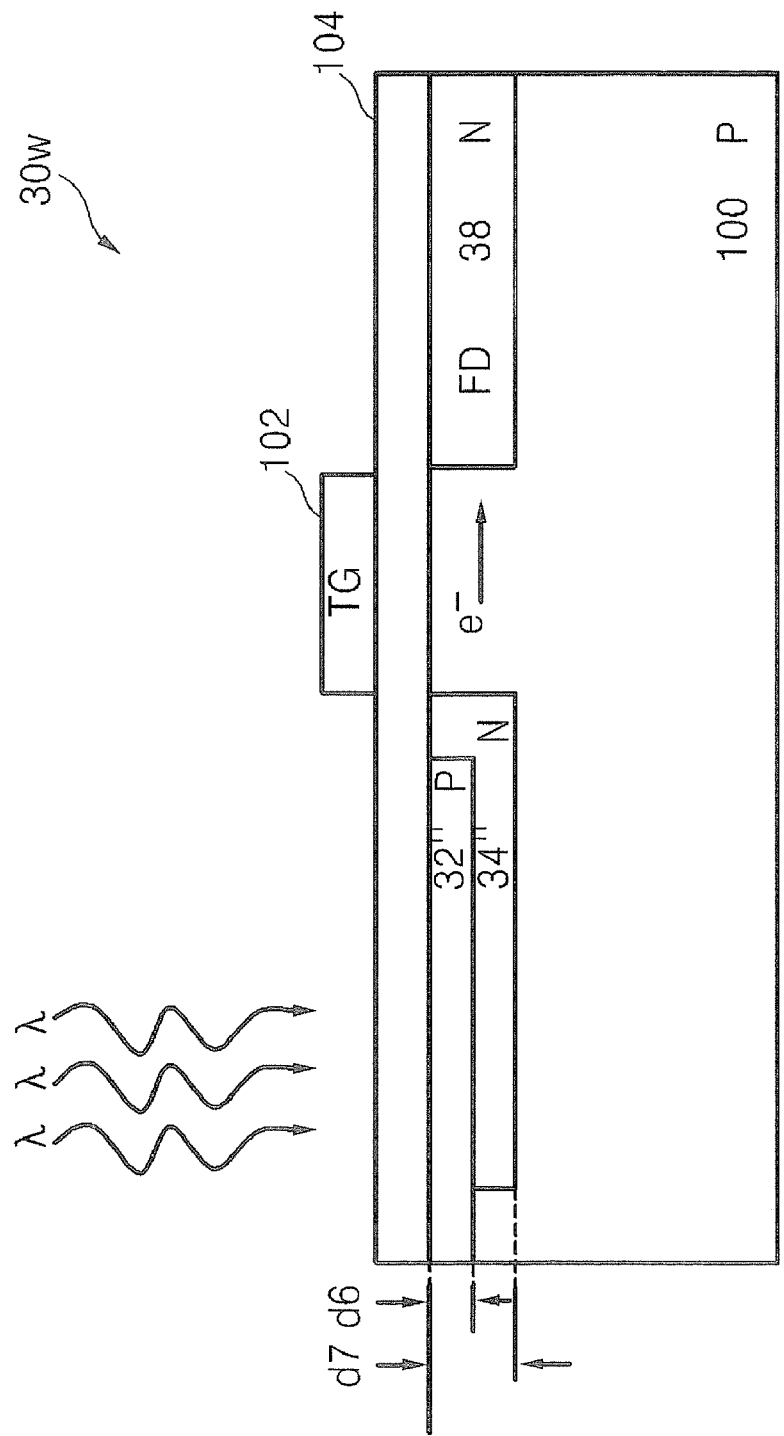
FIG. 3D is a cross-sectional view of a portion of a white-type pixel according to embodiments of the present invention.

Referring now to FIG. 3D, a light receiving portion of a white-type pixel 30w according to an embodiment of the present invention includes a semiconductor region 100 (e.g., semiconductor substrate) of first conductivity type (e.g., P-type) having a primary surface that is configured to receive visible light (λ) thereon. An electrically insulating layer 104, which is provided on the primary surface, may be utilized as a gate insulating layer for a gate electrode 102 of a transfer transistor within an image sensor cell (e.g., 4T cell). The illustrated portion of the white-type pixel 30w includes a photodetector extending immediately adjacent a corresponding portion of the primary surface. The photodetector may be a P-N junction photodiode having a P-type region 32" disposed at least partially within an underlying N-type region 34". The depth $d_6$ of the P-type region 32" may be in a range from about 0.05 um to about 0.3 um and the depth $d_7$ of the N-type region 34" may be in a range from about 0.3 um to about 1.0 um.

The detection of light by the P-N junction photodiode of FIG. 3D results in the generation of electron-hole pairs within the N-type region 34". The electrons (e⁻) collected by the N-type region 34" may be transferred to an N-type floating diffusion (FD) region 38 by operation of the transfer gate electrode 102. This transfer is provided by an N-type inversion layer channel (not shown) that is established in the P-type region 100 in response to application of a sufficiently positive bias to the transfer gate electrode 102. In this manner, the light receiving portion of the white-type pixel 30w illustrated by FIG. 3D replaces the conventional buried photo diode 12 within an image sensor cell (e.g., 4T cell).

Figure 4A:
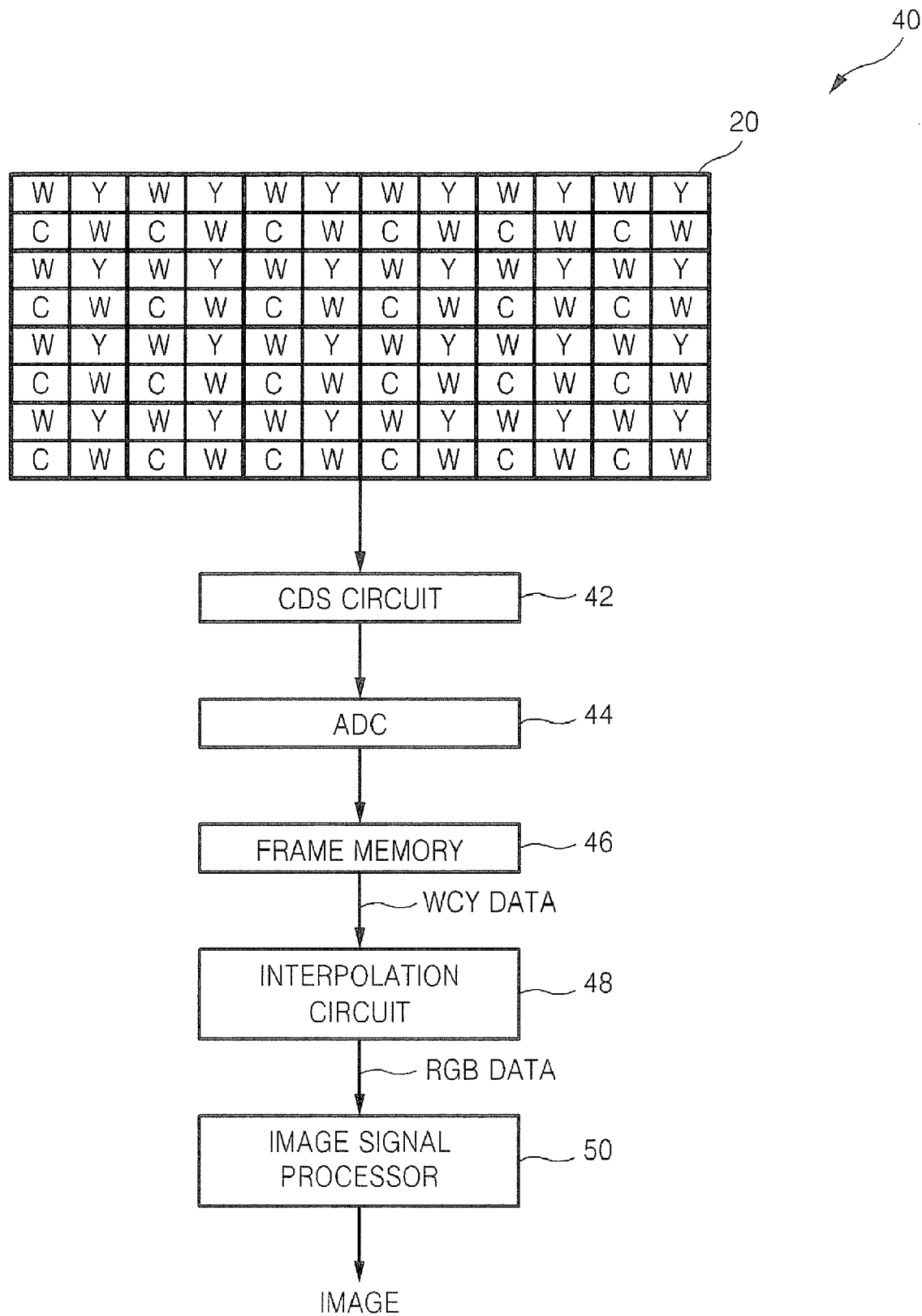
FIG. 4A is a block diagram of an image generating device according to embodiments of the present invention.

FIG. 4A illustrates an image detection and generation system 40 according to an embodiment of the present invention. As illustrated, this system 40 includes a pixel array 20 having a mosaic pattern of pixels therein. This mosaic pattern of pixels includes an equivalent number of cyan-type and yellow-type pixels (C and Y) interspersed among pixels having white color characteristics (W). In particular, the mosaic pattern of pixels, which includes a plurality of the 2×2 arrays of pixels illustrated by FIG. 2A, includes N cyan-type pixels interspersed among N yellow-type pixels and 2N pixels having white color characteristics, where N is a positive integer.

The image sensor circuits within the pixels of the array 20 are configured to generate image sensor data associated with a captured image or sequence of captured images. This image sensor data represents the raw data captured by the cyan-type, yellow-type and white-type pixels. According to the system 40 of FIG. 4A, this image sensor data is provided to a correlated double sampling (CDS) circuit 42, which may be of conventional design. The output of the CDS circuit 42 is passed through an analog-to-digital converter (ADC) 44 to a frame memory 46, which has a sufficient capacity to store multiple frames of data (e.g., a plurality of captured images). The data stored by the frame memory 46, which is identified herein as first color image data (white-cyan-yellow (WCY)), is passed to an interpolation circuit 48. As described more fully hereinbelow with respect to FIG. 4B, this interpolation circuit 48 is configured to convert the first color image data to second color image data having a conventional red-green-blue (RGB) data format. Image processing operations may be performed on the second color image data by an image signal processor 50, which generates an image(s) corresponding to the images originally captured by the pixel array 20.

Figure 4B:
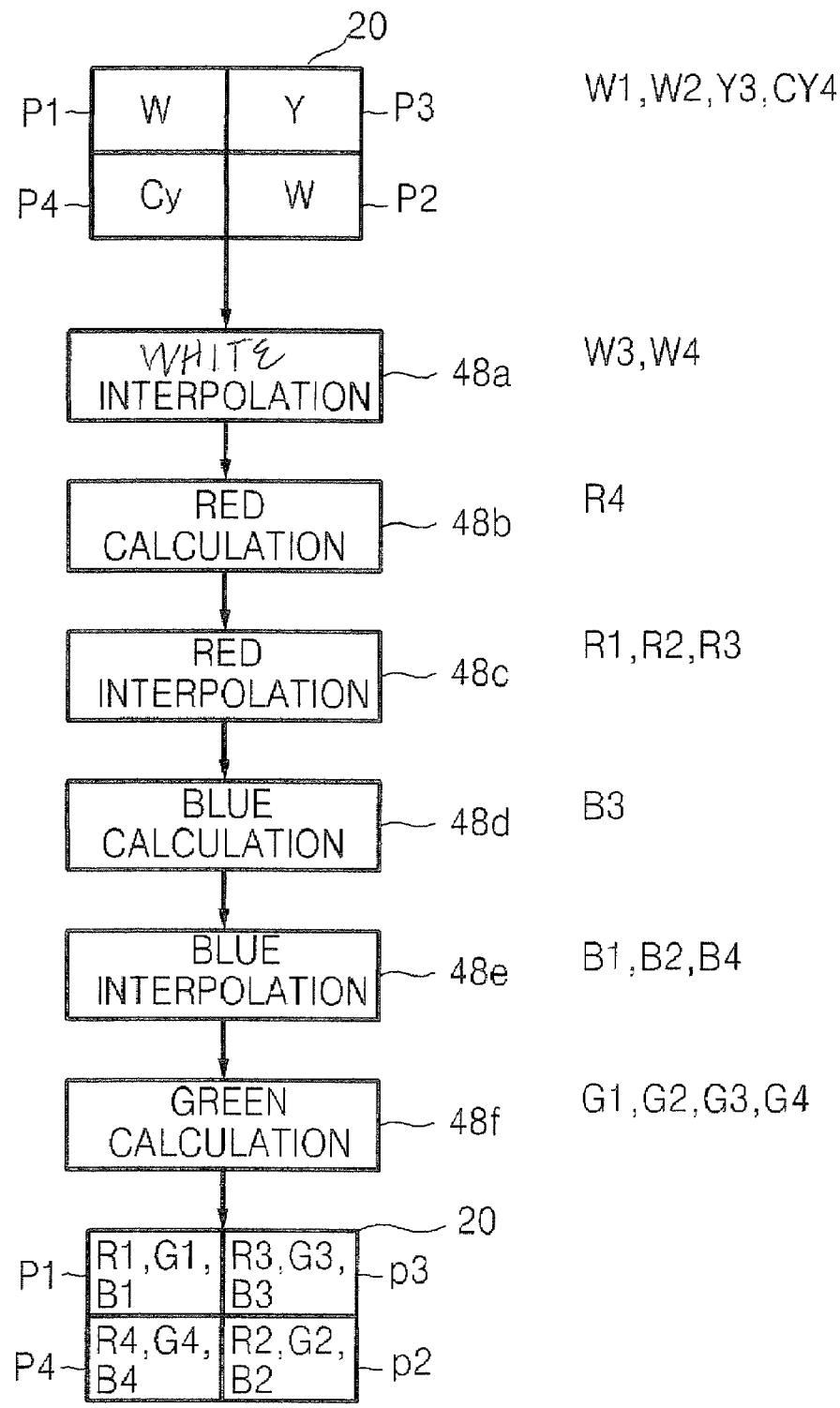
FIG. 4B is a flow diagram of operations that may be performed by the interpolation circuit of FIG. 4A, according to embodiments of the present invention.

Operations performed by the interpolation circuit 48 of FIG. 4A will now be described more fully with reference to FIG. 4B, which illustrates operations to generate a complete set of red (R), green (G) and blue (B) color values from a 2×2 pixel array 20 having two white-type pixels (W1 and W2), a cyan-type pixel (Cy) and a yellow-type pixel (Y). In particular, a first interpolation operation is performed to determine white color values W3 and W4 associated with pixels P3 and P4 from the white color values W1 and W2 generated by pixels P1 and P2, Block 48a. The first interpolation operation may utilize a conventional interpolation algorithm. Thereafter, a red color value R4 associated with the fourth pixel P4 is computed from the interpolated white color value W4 and the pseudo-cyan color value CY4 generated by the fourth pixel P4, Block 48b. This computation may be made according to equation (1):

$$R4=(W4-CY4)/\alpha, \quad (1)$$

where $\alpha$ represents an absorption coefficient associated with the buried layer 36. (See, e.g., FIGS. 3A-3B). The computed red color value R4 is then used to interpolate red color values R1, R2 and R3 associated with pixels P1, P2 and P3, respectively, Block 48c.

TABLE 1

| R11 | R12 | R13 | R14 |
| R21 | R22 | R23 | R24 |
| R31 | R32 | R33 | R34 |
| R41 | R42 | R43 | R44 |

Thus, as illustrated by TABLE 1, the red color values R21, R23, R41 and R43 determined using equation (1), can be used to interpolate R22, R31, R32, R33 and R42 according to the following expressions:

$$R22=(R21+R23)/2$$

$$R42=(R41+R43)/2$$

$$R31=(R21+R41)/2$$

$$R33=(R23+R43)/2$$

$$R32=(R22+R31+R42+R33)/4$$

Referring now to Block 48d, a blue color value B3 associated with the third pixel P3 is computed from the interpolated white color value W3 and the pseudo-yellow color value Y3 generated by the third pixel P3. This computation may be made according to equation (2):

$$B3=(W3-Y3)/\beta, \quad (2)$$

where $\beta$ represents an absorption coefficient associated with the visible light absorption layer 33. (See, e.g., FIG. 3C). The computed blue color value B3 is then used to interpolate blue color values B1, B2 and B4 associated with pixels P1, P2 and P4, respectively, Block 48e.

TABLE 2

| B11 | B12 | B13 | B14 |
| B21 | B22 | B23 | B24 |
| B31 | B32 | B33 | B34 |
| B41 | B42 | B43 | B44 |

Thus, as illustrated by TABLE 2, the blue color values B12, B14, B32 and B34 determined using equation (2), can be used to interpolate B13, B22, B33, B24 and B23 according to the following expressions:

$$B13=(B12+B14)/2$$

$$B22=(B12+B32)/2$$

$$B33=(B32+B34)/2$$

$$B24=(B14+B34)/2$$

$$B23=(B12+B32+B34+B14)/4$$

Finally, as illustrated by Block 48f, the green color values G1, G2, G3 and G4 associated with pixels P1, P2, P3 and P4 can be computed. This computation may be made according to equation (3):

$$Gn=(Wn-(Rn+Bn)) \quad (3)$$

where "n" represents the pixel number. Thus, the operations illustrated by Blocks 48a-48f result in the generation of red, green and blue color values for each of the white, cyan-type and yellow-type pixels within each 2×2 array 20.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An image sensor, comprising:
    a primary photodetector extending adjacent a portion of a surface of a semiconductor substrate configured to receive visible light incident thereon, said primary photodetector comprising a first photodiode in the semiconductor substrate
    a secondary photodetector buried in the semiconductor substrate, said secondary photodetector comprising a second photodiode having a cathode electrically connected to a node of the image sensor biased at a first voltage; and
    a transfer transistor having a first source/drain region electrically connected to a cathode of the first photodiode and a channel region that forms a non-rectifying semiconductor junction with an anode of the second photodiode.

2. The image sensor of claim 1, wherein said secondary photodetector is configured to receive visible light that has passed through said primary photodetector.

3. The image sensor of claim 1, wherein the anode of the second photodiode forms a P-N rectifying junction with the cathode of the first photodiode.

4. The image sensor of claim 3, wherein the node is a power supply node.

5. The image sensor of claim 3, wherein the cathode of the second photodiode is electrically connected to the node by an N-type semiconductor region within the semiconductor substrate.

6. The image sensor of claim 3, wherein the cathode of the second photodiode comprises a buried N-type layer within a P-type substrate region that operates as the anode of the second photodiode.

7. The image sensor of claim 1, wherein the transfer transistor has a second source/drain region that operates as a floating diffusion region within the image sensor.

* * * * *